United States Patent
Falk et al.

(10) Patent No.: US 8,850,226 B2
(45) Date of Patent: Sep. 30, 2014

(54) METHOD FOR TESTING ELECTRICAL COMPONENTS IN MAIN SUPPLY, IN PARTICULAR IN BUILDING

(75) Inventors: Rainer Falk, Erding (DE); Steffen Fries, Baldham (DE); Milos Svoboda, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/517,018

(22) PCT Filed: Nov. 29, 2010

(86) PCT No.: PCT/EP2010/068380
§ 371 (c)(1),
(2), (4) Date: Jun. 18, 2012

(87) PCT Pub. No.: WO2011/073019
PCT Pub. Date: Jun. 23, 2011

(65) Prior Publication Data
US 2012/0260104 A1 Oct. 11, 2012

(30) Foreign Application Priority Data
Dec. 18, 2009 (DE) .......................... 10 2009 058 877

(51) Int. Cl.
*G06F 11/30* (2006.01)
*G06F 12/14* (2006.01)
*H02H 1/00* (2006.01)
*G01R 31/00* (2006.01)

(52) U.S. Cl.
CPC ............ *H02H 1/0076* (2013.01); *Y02E 60/723* (2013.01); *Y04S 10/16* (2013.01); *G01R 31/00* (2013.01)
USPC ........................................ 713/189

(58) Field of Classification Search
CPC . G06F 2221/2103; G06F 21/50; G06F 21/86; G06F 21/445
USPC .......................................... 713/189
See application file for complete search history.

(56) References Cited

U.S. PATENT DOCUMENTS 3,967,264 A * 6/1976 Whyte et al. ............... 340/12.39
5,177,604 A * 1/1993 Martinez ....................... 725/144
(Continued)

FOREIGN PATENT DOCUMENTS

| CN | 101102055 A | 1/2008 |
| CN | 101331707 A | 12/2008 |

(Continued)

OTHER PUBLICATIONS

International Search Report for PCT/EP2010/068380; mailed Feb. 25, 2011.

(Continued)

*Primary Examiner* — Dant Shaifer Harriman
(74) *Attorney, Agent, or Firm* — Staas & Halsey LLP

(57) ABSTRACT

A test comment is transmitted by a test unit in the form of a data transmission via a mains supply to one or more electric components of a network. Each electric component that receives a transmitted test command transmits a test response that characterizes each electric component, in the form of a data transmission via the mains supply back to the test unit, the transmitted response being then evaluated in the test unit.

18 Claims, 2 Drawing Sheets

(56) References Cited

U.S. PATENT DOCUMENTS

| | | | |
|---|---|---|---|
| 5,495,406 A | 2/1996 | Kushiro et al. | |
| 6,691,405 B1 * | 2/2004 | Kagei | 29/832 |
| 8,065,397 B2 * | 11/2011 | Taylor et al. | 709/220 |
| 8,112,483 B1 * | 2/2012 | Emigh et al. | 709/206 |
| 2002/0101695 A1 | 8/2002 | Saksa | |
| 2003/0037170 A1 | 2/2003 | Zeller et al. | |
| 2004/0193329 A1 | 9/2004 | Ransom et al. | |
| 2009/0058190 A1 * | 3/2009 | Tanaka | 307/104 |
| 2009/0292918 A1 * | 11/2009 | Mori et al. | 713/168 |

FOREIGN PATENT DOCUMENTS

| | | |
|---|---|---|
| EP | 1005133 A2 | 5/2000 |
| EP | 1219068 B1 | 12/2007 |
| WO | 2009/149731 | 12/2009 |

OTHER PUBLICATIONS 102009058877.9 Dec. 18, 2009 Rainer Falk et al. Siemens Aktiengesellschaft.

Office Action mailed Nov. 21, 2013 in corresponding Chinese Application No. 201080057742.8.

* cited by examiner

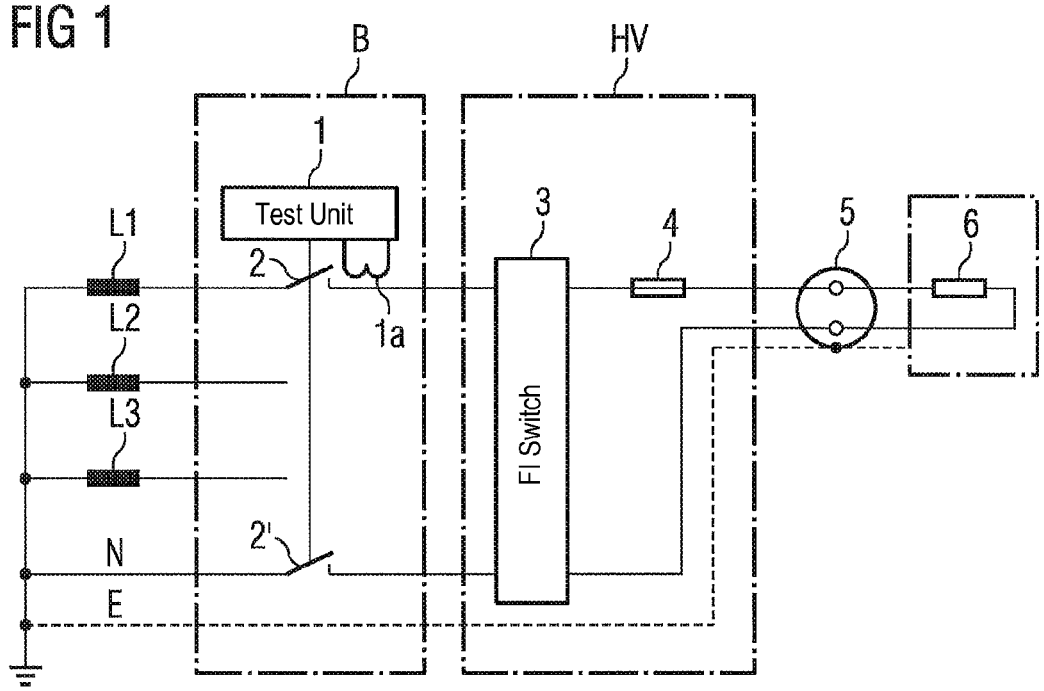
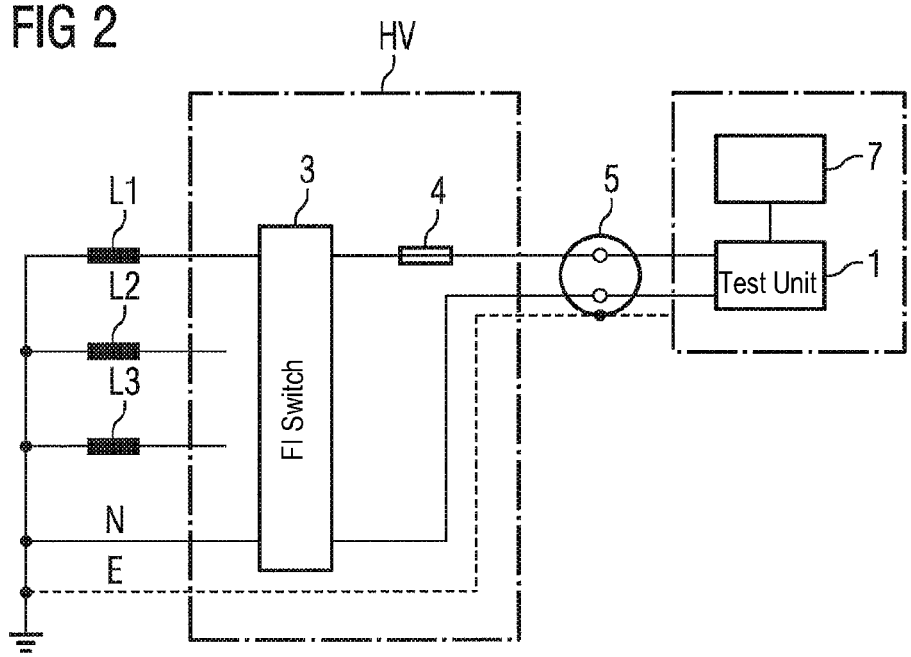

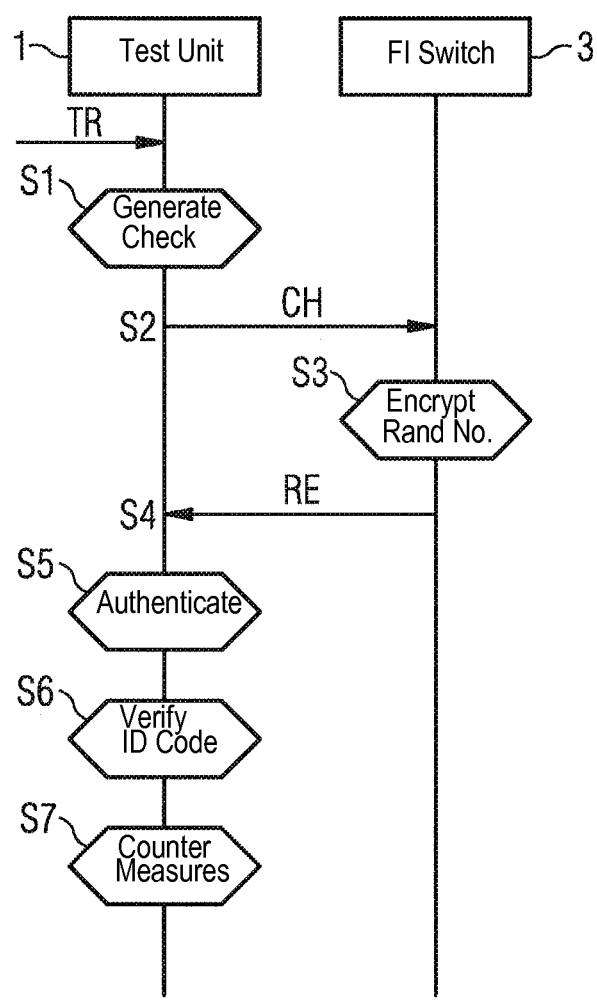

METHOD FOR TESTING ELECTRICAL COMPONENTS IN MAIN SUPPLY, IN PARTICULAR IN BUILDING

CROSS REFERENCE TO RELATED APPLICATIONS

This application is the U.S. national stage of International Application No. PCT/EP2010/068380, filed Nov. 29, 2010 and claims the benefit thereof. The International Application claims the benefit of German Application No. 10 2009 058 877.9 filed on Dec. 18, 2009, both applications are incorporated by reference herein in their entirety.

BACKGROUND

Described below is a method for testing electrical components in a mains supply, in particular a mains supply for a building, and to a corresponding test unit and a corresponding electrical component for use in such a method.

Various methods are known from the related art for suitable identification of technical products in order to distinguish these products from retrofitted or counterfeited products. For example what are known as RFID tags can be used, with which information about a technical product, especially an electronic product code, can be read out wirelessly. The inclusion of semiconductor chips in technical devices is also known, which can carry out cryptographic operations in order to reliably identify an original product in this way. Putting the security features on technical products or packages by printing a code or hidden pictures on them is also known. The hidden pictures can be made visible in such cases only by a special decoder lens.

In mains supply networks it is especially important for reasons of safety for the electrical components included in the networks to satisfy particular safety requirements, in order to avoid malfunctions in this way, which can lead to damage to electrical loads in the supply network or under some circumstance also present a danger for human users or the supply network. Specific malfunctions of electrical components in a mains supply can if necessary be detected directly via the detection of currents or voltages occurring in the supply network. However a method by which individual electrical components in a mains supply can be tested in a simple manner is not known.

SUMMARY

Therefore, the testing of electrical components in a mains supply is possible in a simple manner.

The method makes it possible to test electrical components in a mains supply and can especially be used in a local building mains supply, such as a mains supply of a household or of a plurality of households for example. A check command is sent by a test unit by a data transmission via the mains supply to one or more electrical components of the mains supply. Subsequently a respective electrical component which receives the check command directed to it returns a test response characterizing the respective electrical component to the check unit via the mains supply by a data transmission, after which the test response sent is evaluated in the test unit. The method can be used in such cases for testing any given electrical components included in the mains supply. The method may be used to test fuses and or earth leakage circuit breakers in the mains supply, since these components fulfill safety functions, so that a malfunction of these components can have serious consequences under some circumstances.

The underlying idea is that a data transmission of the mains supply can be use to identify electrical components in the mains supply on the basis of check commands or test responses. This means that no separate transmission channels have to be created in order to make possible an exchange of communication between a test unit and the electrical components to be tested. In this way the method can be realized in a simple manner.

Based on a suitable evaluation of the test responses faulty installations of the mains supply or the use of faulty components in the mains supply and hereby potential problems can be recognized at an early stage using the method. Difficult-to-access or inaccessible electrical components can also easily be tested. This enables damage to electrical lines, electrical devices right through to fires and injuries to human users (by electric shocks for example) to be prevented. Furthermore retrofitting of electrical components, components without the required test certificate or the use of incorrect components (underdimensioned, incorrect voltage range, not intended to be used in an industrial environment) can be detected. Deviations by an electrical installation from corresponding standards can if necessary be detected in an automated manner, if for example a corresponding earth leakage circuit breaker fails in the installation or if a fuse in the mains supply is specified for an incorrect rated current.

In an embodiment of the method, the evaluation of the test response includes an authentication of the electrical component returning the test response. In this authentication the electrical component is authenticated in the test unit via the check command sent out by the test unit and via the test response returned by the electrical component. Any given authentication methods known from the related art can be used in such cases. This variant has the advantage of enabling retrofits or counterfeits of electrical components to be recognized in the mains supply.

In an embodiment, an authentication of the electrical component is carried out such that the check command contains verification data which is cryptographically secured (e.g. encrypted) by the respective electrical components which receives the check command directed to it, with the cryptographically-secured verification data being returned within the test response and the respective electrical components successfully authenticated in the test unit if the cryptographically-secured authentication data is able to be verified (e.g. decrypted) in the test unit. This variant is based on the principle of the challenge-response method known from the related art. The verification data in this case may include a corresponding pseudo random number which is generated by the test unit. The term cryptographic security is to be widely interpreted here and below. In specific embodiments the cryptographic security includes an encryption of the verification data and/or the digital signing of the verification data and/or the formation of a cryptographic checksum (e.g. of a message authentication code) based on the verification data.

In a further variant method an electrical component is authenticated via an individual symmetrical key. In such cases the verification data is cryptographically secured (e.g. encrypted) in the respective electrical component with a symmetrical key stored in the respective electrical component, wherein for verification (e.g. decryption) of the cryptographically-secured verification data, the symmetrical key is also stored in the test unit or is derived from a master key stored in the test unit with identification data of the electrical component contained in the test unit. An AES algorithm or an SHA-1 or SHA-256 algorithm can be used as the encryption algorithm for example. As an alternative or in addition authentication can also be undertaken based on an asymmetrical authentication method. In this case the verification data of the respective electrical component is secured (e.g. encrypted) with a private key stored in the respective electrical component, wherein a public key contained in the test response is used to verify (e.g. decrypt) the cryptographically-secured verification data, if a certificate contained in the test response is successfully verified by the test unit (e.g. decrypted). There is also the possibility of using a public key which is already stored beforehand in the test unit for verifying the cryptographically-secured verification data. An RSA or an algorithm based on elliptical curves can be used as the crypto algorithm, such as a multiplication by a key parameter or EC-DAS for example.

The test response which characterizes the respective electrical component can be designed in any given manner. In one variant the test response as characterizing data can only contain the cryptographically-secured verification data described above, with the corresponding electrical component being wherein the cryptographic security. As an alternative or in addition the test response further includes one or more items of information about the identity and/or about characteristic properties of the respective electrical component, such as an identification code or a unique serial number of the respective electrical component for example or technical properties of the electrical component, or variables characterizing the operation of the electrical component. These include for example permitted rated voltages or voltage ranges, rated currents, tripping characteristics power consumption and the like.

In a further embodiment the check command is sent out from the test unit to one or more predetermined electrical components in the mains supply, i.e. an electrical component or a group of electrical components for which the check command is valid is also specified in the check command. Where necessary there is also the option for the check command to be sent out as a broadcast command in the mains supply network in response to which each electrical component receiving the command responds to the check command with a corresponding test response.

As already mentioned above, a data transmission over the main supply is used in the method for transferring check commands and test responses. This data transmission can for example be based on PLC communication (PLC=Power Line Communication) long known from the related art. Based on this method, which is specified by various standards, information is transferred in the mains supply by high-frequency signals, which are modulated onto the low-frequency voltage curve (usually 50 Hz or 60 Hz).

If necessary the check command and the test response can also be transferred on the basis of a data transmission by a load modulation. In load modulation information is transmitted by connecting and/or modifying one or more electrical loads in the mains supply. This causes a change in the current or voltage curve respectively, which can be measured in the test unit. Appropriate information can be obtained based on the measurement.

In a further variant method the check command and the test response are transferred on the basis of a data transmission by a leading-edge and a trailing-edge phase control. This control is known per se from the related art. In such controls an AC voltage is switched on delayed after the zero crossing by electrical components such as thyristors. A suitable delay of the switch-on process of the current is also now used in this variant in order to encode information in the mains supply in this way.

In a further embodiment the check command and the test response are transferred based on a data transmission by the carrier signal, which is modulated by modulation methods long known from the related art in the form of a frequency shift keying (FSK) and/or phase shift keying (PSK) and/or pulse width modulation.

The test responses returned can be evaluated in different ways. In an embodiment one or more of the electrical components of the mains supply is checked in respect of fulfilling one or more criteria, with one or more actions being carried out by the test unit depending on the result of the check. The action or actions can for example include one or more of the following actions, with these actions being carried out in particular if one or more of the criteria or not fulfilled or are not adequately fulfilled:

changing the setting of one or more of the electrical components provided setting parameters of the electrical components can be adapted in a suitable manner;

disconnecting the power network from a mains supply or preventing the power network being connected to a mains supply;

transfer of data relating to the configuration of the mains supply to a control center;

output of a message able to be perceived by a user, with this message being able to be output for example as a warning message on detection of impermissible or incorrectly installed components in the power supply and/or on detection of faulty electrical components.

The method in this case is not restricted to specific type of evaluation. Instead the evaluation can be embodied in a suitable manner as a function of the desired check or the electrical components to be tested.

As well as the method described above, a test unit may be embodied such that during operation it sends the check command by the data transmission via a mains supply to one or more electrical components of the mains supply. The test unit further evaluates a test response which is returned by the data transmission over the mains supply to the check unit from a respective electrical component and which characterizes the respective electrical component. Any variant of the method described above can if necessary be realized with the test unit. This means that each of the features described above in relation to the test method relating to the embodiment of the test unit can also be realized in the test unit.

The test unit in this case can be a portable test unit, especially one which is able to be connected to the mains supply via a power socket. As an alternative or in addition there is how-ever the option of the test unit being a component able to be permanently installed in the mains supply, which is especially able to be built into an electricity meter and/or into a consumer unit.

An electrical component for use in the method described above may be embodied such that during operation in a mains supply, on receiving a check command of a test unit, it returns a test response by the data transmission via the mains supply to the test unit, with the test response characterizing the electrical component and being able to be evaluated by the test unit. In such cases each of the variants of the method described above can be realized if necessary by the electrical component. This means that the electrical component can if necessary include each of the features described above in relation to the testing method, provided the corresponding feature relates to the electrical component.

BRIEF DESCRIPTION OF THE DRAWINGS

These and other aspects and advantages will become more apparent and more readily appreciated from the following description of the exemplary embodiments, taken in conjunction with the accompanying drawings of which:

FIG. 1 is a schematic diagram of a first exemplary embodiment;

FIG. 2 is a schematic diagram of the second exemplary embodiment; and

FIG. 3 is a flowchart which illustrates the messages exchanged between a test unit and an electrical component in a variant of the method.

DETAILED DESCRIPTION OF THE PREFERRED EMBODIMENT

Reference will now be made in detail to the preferred embodiments, examples of which are illustrated in the accompanying drawings, wherein like reference numerals refer to like elements throughout.

FIG. 1 shows a first embodiment of the method for testing electrical components using a mains supply in a household as an example. In accordance with FIG. 1 an electrical alternating current based on a three-phase voltage of 230 V over corresponding lines L1, L2 and L3 is supplied to a mains supply of a household. Each of the lines L1 to L3 represents a phase of the alternating current here. Also shown in FIG. 1 is a neutral conductor N as well as a grounding conductor E shown by a dashed line. In accordance with the diagram depicted in FIG. 1 the testing of the electrical components connected to line L1 is illustrated by way of example. The current on the line L1 reaches a main distributor HV, of which a corresponding earth leakage circuit breaker 3 (also referred to as an Fl switch) and a fuse 4 (e.g. 16A) are shown as typical examples. These components lead to a corresponding protected-contact socket 5 in the household, which supplies power to a consumer 6. The main distributor HV as a rule includes a number of components in each case which can be tested based on the method. Only the testing of the switch 3 and the fuse 4 is described below by way of example.

A test unit 1 is provided for testing the components 3 and 4, which is depicted within a box B and can both form a part of the consumer unit HV or can also be suitably connected upstream from the unit. The corresponding switches 2 and 2' are able to be actuated via the test unit 1, with which under particular circumstances the power supply through to the socket 5 and to the consumer 6 can be interrupted, as will be described in greater detail below.

The test unit 1 generates corresponding check commands for testing the electrical components 3 or 4, which are transferred via the mains supply, to the Fl switch 3 or the fuse 4. Any given method known from the related art can be used for information transfer via the lines of the mains supply in this case. In particular the data can be transferred by a PLC method in which a modulated high-frequency signal is generated on the power line. A schematically indicated coupling device 1a is provided for this purpose which couples a modulated carrier signal into the mains supply or decouples it from the supply. The check command can in this case be embodied such that it accesses a specific electrical component which then responds with a corresponding test response. It is however also possible for the check command to be sent as a broadcast to the mains supply, in response to which all electrical components which receive the check command return a corresponding test response. As well as the PLC method mentioned, load modulation can also be used for data transmission via the mains supply, in which information is transmitted via a load able to be connected into the mains supply or a load with a varying ohmic resistance, with this information being detected by measuring the change in the current as a result of the changing load in the test unit 1. The other methods mentioned at the start can also be used for data transmission, especially leading-edge or trailing-edge phase control, data transfer based on frequency shift keying or phase shift keying and/or pulse width modulation and the like.

Based on the check command and the test response, in the embodiment described here, the electrical component is authenticated with the aid of corresponding keys using a challenge-response method which is explained below in relation to FIG. 3. The test response generated within the framework of this method is in its turn returned to the test unit 1 based on a suitable data transmission, such as PLC for example, via the mains supply. In this case the test response contains characteristic information relating to the electrical component returning the test response, for example the manufacturer of the electrical component and/or the model of the electrical component and/or a unique serial number of the electrical component and/or information in respect of the approval of the electrical component and/or characteristic properties of the electrical component such as mains voltage/ permitted voltage range for example, the nominal current of a fuse (rated current), the tripping characteristic, the rated switching capacity, the maximum power consumption, the current consumption during the switch on process, the earth leakage circuit breaker, the requirement for an uninterruptible power supply or an earth leakage circuit breaker for the tested electrical component and the like. The decisive factor in this case is that information which is specific to the corresponding electrical components or which characterizes the components is transferred. If necessary this information can also only include authentication information in order to simply check in the test unit 1 whether the component fitted is an original component of the manufacturer or a fake.

On the basis of the information in the received test responses, the test unit 1 then decides whether protective mechanisms may have to be initiated for the mains supply. This decision can for example be made in a nominal configuration of the mains supply of the household stored in the test unit, with corresponding measures being taken for greater deviations of the configurations currently determined by the test responses from the nominal configuration, to continue to guarantee a safe operation of the mains supply. For example, depending on the information in the test response, the reduction of the overall protected load, the reduction of the sensitivity of the tested earth leakage circuit breaker and the like can be introduced as protective measures. These mechanisms require support of the respective functionality by the corresponding electrical components. For example fuses checked by the test unit can be embodied as "software fuses" in which the limit value for the maximum current does not have to be rigidly determined but can be adapted in a suitable manner to the connected consumers and thus to a maximum load. A further protective measure can especially also be the opening of the switches 2 or 2' shown in FIG. 1, provided adequate security is no longer guaranteed in the mains supply in accordance with specific criteria, because for example fakes are being used as electrical components in the mains supply. There is also the option that, in the event of the electrical components being tested with open switches 2 and 2', the connection of the consumer circuit by the switches 2 and 2' is only permitted if a test criterion of the connected consumers which can also be tested by the test unit is fulfilled, such as a correct rated voltage, a maximum total load and the like for example.

In a further variant of the method, based on the test responses received in a test unit, different consumer circuits in a consumer unit can be switched as a function of the properties of the connected devices to different supply lines. In a further variant the option exists for example of the test unit establishing via a terminal a communication connection to a control center in order to transfer information about the tested components to the control center. The information in this case can in its turn if necessary also be transmitted via a mains supply, based for example on the PLC method. If the test unit is integrated for instance within an electricity meter of the household, a corresponding PLC connection is often already available to read out the counter data, which can then also be used, based on the received test responses, to transfer corresponding information about the tested electrical components to a control center. In such cases in particular a message is issued to the control center if a test unit established is that new electrical components have been permanently introduced into the power circuit which can not adequately authenticate themselves. This makes it possible to establish changes to an installation.

The test unit shown in FIG. 1 is permanently integrated into the mains supply of a household, for example within the consumer unit or as a part of an electricity meter. However the option also exists of embodying the test unit as a separate and especially as a portable device, in order if need be to carry out a check on the corresponding electrical installation in a household mains supply. This type of exemplary embodiment is illustrated in FIG. 2.

The embodiment of FIG. 2 in this case largely corresponds to the form of the embodiment shown in FIG. 1, so that the same reference characters will be used for the same components. A part of the household mains supply is again reproduced in FIG. 2, to which power is supplied via the consumer unit HV via corresponding lines L1 to L3. Once again the testing of an earth leakage circuit breaker 3 as well as a fuse 4 within the consumer unit HV are described by way of example, with these components leading to a protected-contact socket 5. Like the embodiment of FIG. 1, the test unit 1 is not permanently installed in the mains supply but is a portable test unit which is connected to the socket 5. Like the test unit of FIG. 1, the electrical components in the form of the earth leakage circuit breaker 3 and the fuse 4 are tested in the portable test unit. The result of the test or a corresponding warning are now shown on a display D which is connected to the test unit 1 or forms part of this unit. Like the test unit of FIG. 1 the check commands or test responses are transmitted in this case respectively to and from the components 3 or 4 by the mains supply.

To illustrate the method, FIG. 3 shows an example of the sequence of testing an earth leakage circuit breaker 3 by the test unit 1. The operations executed by the test unit 1 are reproduced in this figure along the left-hand vertical line and the operations executed by the earth leakage circuit breaker 3 along the right-hand vertical line. The method starts on the basis of a trip signal TR, which is generated at intervals for example. The trip signal can for example also be generated by a user input at the test unit. At S1 a check command is first generated by the test unit in the form of what is known as a Challenge CH, which includes a pseudo random number generated by the test unit 1. This random number is transferred in S2, with a suitable method described above, via the mains supply to the earth leakage circuit breaker 3. The circuit breaker in this case contains a suitable chip for carrying out cryptographic functions.

Then, in S3, with the aid of the chip, based on a secret, private cryptographic key, the random number is encrypted and integrated into a test response in the form of a response RE. This response is transferred back in S4 to the test unit 1, with the data once again being transmitted via the mains supply using a suitable method. The response RE, as well as the encrypted random number, also contains further device-specific information of the earth leakage circuit breaker 3, with at least a product identification code being contained in the embodiment described here. In addition the response RE contains a digitally-signed certificate of a certification body with a public key being contained within the certificate.

After the response RE has been received in the test unit 1, in S5 an authentication process is carried out, with the response RE first being verified for its validity. This is done by the validity of the certificate contained in the response being checked by a check of its digital signature, with information from the corresponding certification body stored for this purpose in the test unit 1 being used or information being requested online via a suitable data connection from the certification body. If the certificate proves to be valid an attempt is made to decrypt the encrypted random number in the response RE via the public key contained in the certificate. If the decryption is successful, the earth leakage circuit breaker 3 is successfully authenticated.

Should the decryption and thereby the authentication not be successful, corresponding counter measures can be taken by the test unit 1 or a corresponding warning can be output, e.g. a warning as to the fact that it has been established that a component not able to be authenticated is installed in the mains supply, which under some circumstances can be a fake.

In the embodiment of FIG. 3, in S6, following a successful authentication in S5, the product identification code contained in the response RE is verified. In this case configuration information is stored in the test unit 1 which specifies which earth leakage circuit breaker was originally installed in the mains supply. If the product identification code in the response RE does not match the product identification code in accordance with the configuration data, no further measures are to be undertaken by the test unit. Should deviations occur, corresponding countermeasures can be initiated in S7, in particular a warning can be output or the security functions within the mains supply can be improved, by the value for the maximum current of a fuse in the mains supply being reduced for example. If necessary the option also exists of disconnecting the mains supply completely from the power supply network.

An identification and authentication of an electrical component based on an asymmetric method with a private secret key and with a public key has been described on the basis of FIG. 3. The method for authentication can however be varied in any given way, in particular a symmetrical method with a single key can also be used. This key can once again be used to encrypt a challenge CH in circuit breaker 3. The same key is also used in this case by the test unit 1 for decryption, with the key being able to be stored in advance in the test unit or be derived based on a master key in the test unit 1. As an alternative, a challenge-response method can also be implemented here using cryptographically-based checksums (HMAC). The symmetrical key is included in the computation on both sides here. The key is then derived especially with the aid of a unique identification of the circuit breaker 3 which is transmitted within the response RE. An HMAC-SHA1 algorithm can be used for example to derive the key in which the master key and the unique identification of the circuit breaker are included as input parameters. In a variant of the method there is also the option to dispense with an upstream authentication and for only transferred identification data of the electrical components to be checked. The option also exists of only an authentication being carried out and no further identification data in the form of a product identification being transferred.

The embodiments described above of the method have a series of advantages. They make it possible to authenticate electrical components in a mains supply, especially to authenticate circuit breakers and fuses, by a data transmission within the mains supply. This enhances the safety of an electrical system since incorrect installations and non-approved electrical components can be recognized. In addition the automatic recording of the actual electrical installation can be made possible by the identification of the connected electrical components. Likewise the changes to the core installation can be established. Furthermore appropriate protective measures can be initiated in accordance with one or more criteria if the electrical installation does not satisfy specific requirements, for example if components not able to be authenticated are installed therein or if the electrical installation deviates from an expected configuration. The protective measures can be designed in any given way. They can if necessary just provide a warning to a control center or to the user of the test unit.

The testing of electrical components can be realized using known methods of a data transmission over the mains supply as well as corresponding cryptographic methods. The cryptographic functions can for example be carried out by a corresponding chip which is installed in the test unit or the electrical components to be tested. In this way a cost-effective integration of a test functionality into corresponding electrical components, such as fuses, earth leakage circuit breakers and the like is achieved.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A method for testing electrical components in a household mains supply, comprising:
   sending a check command from a test unit by data transmission over the household mains supply to at least one internal electrical component of the household mains supply;
   returning a test response containing information at least one of identifying and indicating characteristic properties of a respective electrical component receiving the check command, by data transmission over the household mains supply to the test unit from the respective electrical component; and
   evaluating the test response returned to the test unit.

2. The method as claimed in claim 1, wherein the at least one internal electrical component of the household mains supply includes at least one fuse and/or at least one earth leakage circuit breaker.

3. The method as claimed in claim 2, wherein said evaluating the test response comprises authenticating the respective electrical component returning the test response in the test unit based on the check command sent out by the test unit and the test response returned by the respective electrical component.

4. The method as claimed in claim 3,
   wherein the check command includes verification data,
   wherein said method further comprises cryptographically securing the verification data in the check command to obtain cryptographically-secured verification data at the respective electrical component,
   wherein said returning returns the cryptographically-secured verification data within the test response, and
   wherein said authenticating the respective electrical component at the test unit is based on the cryptographically-secured verification data returned to the test unit.

5. The method as claimed in claim 4, wherein said cryptographically securing of the verification data of the respective electrical component uses a symmetrical key stored in the respective electrical component and in the test unit for said authenticating, or a derived key derived from a master key stored in the test unit and identification data of the respective electrical component.

6. The method as claimed in claim 4, wherein said cryptographically securing of the verification data of the respective electrical component uses a private key stored in the respective electrical component corresponding to a public key included in the test response used in said authenticating of the cryptographically-secured verification data.

7. The method as claimed in claim 6, wherein said authenticating of the cryptographically-secured verification data further comprises verifying a certificate in the test response corresponding to the private key.

8. The method as claimed in claim 1, wherein said sending sends the check command from the test unit to at least one predetermined electrical component in the household mains supply or as a broadcast command into the household mains supply.

9. The method as claimed in claim 1, wherein said sending the check command and said returning the test response are performed by a data transfer by a power line communication.

10. The method as claimed in claim 9, wherein said sending the check command and said returning the test response are performed by a load modulation, with the information is transmitted by connection and/or modification of one or more electrical loads.

11. The method as claimed in claim 9,
    wherein the check command and the test response are transferred based on a data transmission by a leading-edge and/or trailing edge phase control, and
    wherein information is transmitted by delaying the current in the mains network.

12. The method as claimed in claim 1, wherein said sending the check command and said returning the test response are each performed by a carrier signal modulated by at least one of frequency shift keying, phase shift keying and pulse width modulation.

13. The method as claimed in claim 1,
    wherein said evaluating of the returned test response includes checking the respective electrical component of the household mains supply is checked for compliance with a criterion or criteria, and
    wherein said method further comprises performing at least one action by the test unit depending on a result of said checking.

14. The method as claimed in claim 13, wherein the at least one action includes at least one of:
    changing a setting of the respective electrical component;
    disconnecting the household mains supply and mains;
    preventing connection of the mains and the household mains supply;
    transferring configuration data relating to configuration of the household mains supply to a control center; and
    outputting a message to a user.

15. A test unit for testing electrical components in a household mains supply, comprising:
    means for sending a check command by data transmission over the household mains supply to at least one internal electrical component of the household mains supply;

means for receiving a test response containing information at least one of identifying and indicating characteristic properties of a respective electrical component receiving the check command, by data transmission over the household mains supply from the respective electrical component; and means for evaluating the test response returned to the test unit.

16. The test unit as claimed in claim 15,
wherein the test unit is portable, and
wherein the test unit further comprises means for connecting to the mains supply via a socket.

17. The test unit as claimed in claim 15, wherein the test unit is a component installed permanently in one of an electricity meter and a consumer unit.

18. An internal electrical component of a household mains supply connected to a test unit via the household mains supply, comprising:

means for receiving a check command from the test unit by data transmission over the household mains supply; and means for returning a test response of the check command to the test unit by data transmission over the household mains supply, the test response characterizing the internal electrical component in an evaluation by the test unit.

* * * * *